(12) United States Patent
Zhang

(10) Patent No.: US 8,714,036 B2
(45) Date of Patent: May 6, 2014

(54) DUMMY FOR TESTING RACK SIZE

(75) Inventor: Bing-Jun Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 380 days.

(21) Appl. No.: 13/081,470

(22) Filed: Apr. 6, 2011

(65) Prior Publication Data

US 2012/0240693 A1 Sep. 27, 2012

(30) Foreign Application Priority Data

Mar. 24, 2011 (CN) .......................... 2011 1 0071937

(51) Int. Cl.
*G01B 3/46* (2006.01)

(52) U.S. Cl.
USPC ........................................................ 73/866.4

(58) Field of Classification Search
USPC ........................................................ 73/866.4
See application file for complete search history.

(56) References Cited

U.S. PATENT DOCUMENTS

| | | | | |
|---|---|---|---|---|
| 3,103,268 | A * | 9/1963 | Atkinson | ........................ 16/409 |
| 7,392,888 | B2 * | 7/2008 | Lai | ................. 190/126 |
| 7,640,670 | B2 | 1/2010 | Zhang | |
| 7,874,409 | B1 * | 1/2011 | Lakhal | ........................ 190/105 |
| 2001/0031106 | A1 * | 10/2001 | Plesh, Sr. | ...................... 384/537 |
| 2008/0078636 | A1 * | 4/2008 | Lai | ................. 190/127 |
| 2008/0099286 | A1 * | 5/2008 | Lee | ................. 188/29 |

* cited by examiner

*Primary Examiner* — Hezron E Williams
*Assistant Examiner* — Paul West
(74) *Attorney, Agent, or Firm* — Novak Druce Connolly Bove + Quigg LLP

(57) ABSTRACT

A dummy for testing whether sizes of receiving spaces for receiving electrical elements in an enclosure are suitable or not. The dummy includes a frame and a handle attached to the frame. The frame includes a bottom wall. A number of wheels are rotatably attached to opposite ends of the bottom wall. Thereby, the frame is slidably received in the enclosure. A width and a height of the frame are respectively equal to minimum values of a width and height of one of the receiving spaces.

5 Claims, 4 Drawing Sheets

DUMMY FOR TESTING RACK SIZE

BACKGROUND

1. Technical Field

The present disclosure relates to dummies for testing rack sizes, particularly to a dummy for testing whether sizes of receiving spaces in a blade enclosure are suitable for receiving electronic elements or not.

2. Description of Related Art

Blade servers are received in a blade enclosure defining a plurality of receiving spaces. The receiving spaces need to be tested to determine whether the sizes of the receiving spaces are qualified or not for the blade servers. In the test, a blade server is inserted into each of the receiving spaces. However, the blade server is too heavy to be manipulated conveniently. Furthermore, the blade server tends to become worn and the accuracy of the testing may be imprecise.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
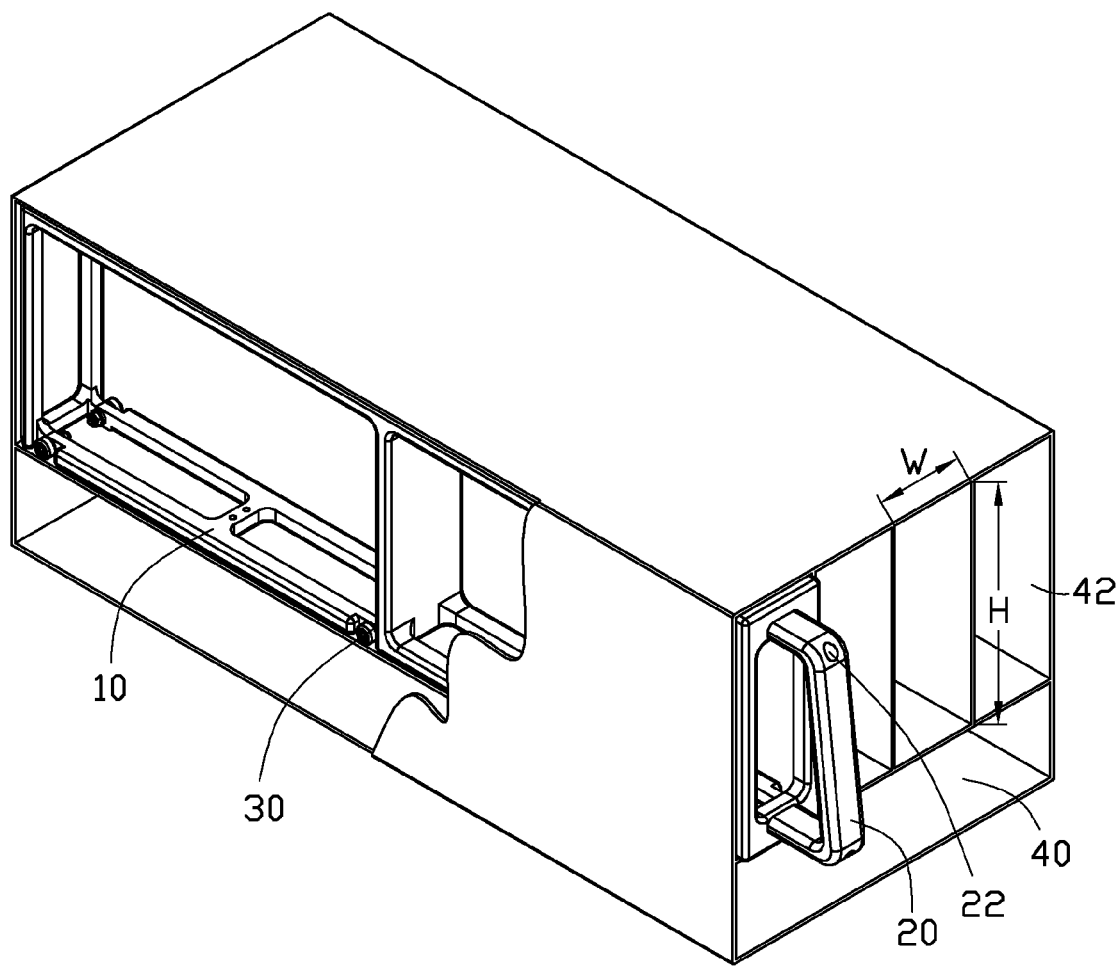
FIG. 1 is an isometric view showing a state of use of an exemplary embodiment of a dummy for testing rack size, together with a blade enclosure with portion of it cut away.

Referring to FIG. 1, an exemplary embodiment of a dummy for testing rack size is provided for testing inside dimensions of receiving spaces 42 partitioned in a blade enclosure 40 for receiving blade servers are suitable or not. The dummy includes a frame 10, a handle 20 attached to the frame 10, and a plurality of sliding members 30.

Figure 2:
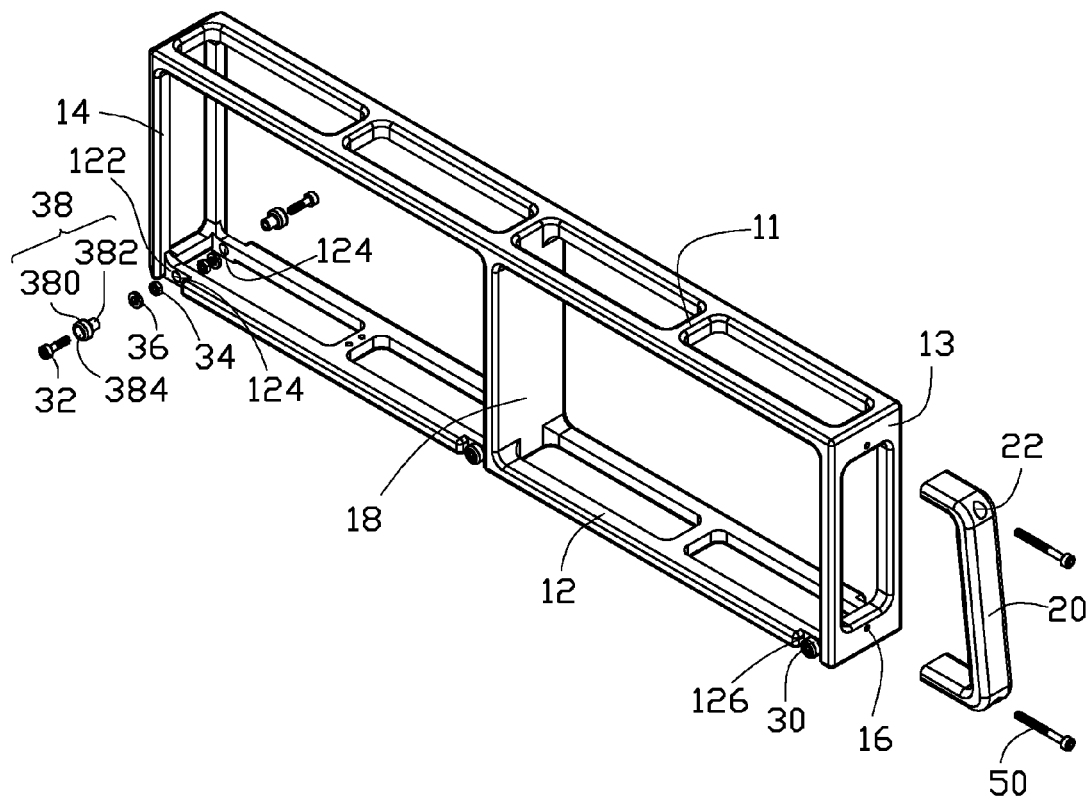
FIG. 2 is an exploded, isometric view of the dummy of FIG. 1

Referring to FIG. 2, the frame 10 is rectangular-shaped and includes a top wall 11, a bottom wall 12 opposite to the top wall 11, a front wall 13 perpendicularly connected between front ends of the top wall 11 and bottom wall 12, and a rear wall 14 perpendicularly connected between rear ends of the top wall 11 and bottom wall 12. The frame 10 is hollow among the walls 11-14, and the walls 11-14 each define a plurality of through holes (not labeled) therein, thereby minimizing the weight of the dummy. A rib 18 connected between centers of the top and bottom walls 11 and 12 for preventing distortion of the frame 10. A plurality of installing portions 122 is formed in opposite sides of the bottom wall 12. In this embodiment, each installing portion 122 is a through hole 124 defined in the bottom wall 12, parallel to the front and rear walls 13 and 14. Two cutouts 126 are respectively defined in opposite sides of the bottom wall 12, communicating with the through hole 124. Two screw holes 16 are defined in the front wall 13, respectively adjacent to the top and bottom walls 11 and 12.

Each sliding member 30 includes a screw 32, a nut 34, a washer 36, and a wheel 38. The wheel 38 includes a rolling portion 380 and an extension portion 382 extending from a side of the rolling portion 380. A substantially T-shaped through hole 384 is axially defined in the wheel 38, extending through the rolling portion 380 and the extension portion 382. The through hole 384 includes a first part defined in the rolling portion 380, and a second part defined in the extension portion 382 and less than the first part in diameter (shown in FIG. 4)

The handle 20 is substantially U-shaped, and defines two through holes 22 in opposite ends of the handle 20.

Figure 3:
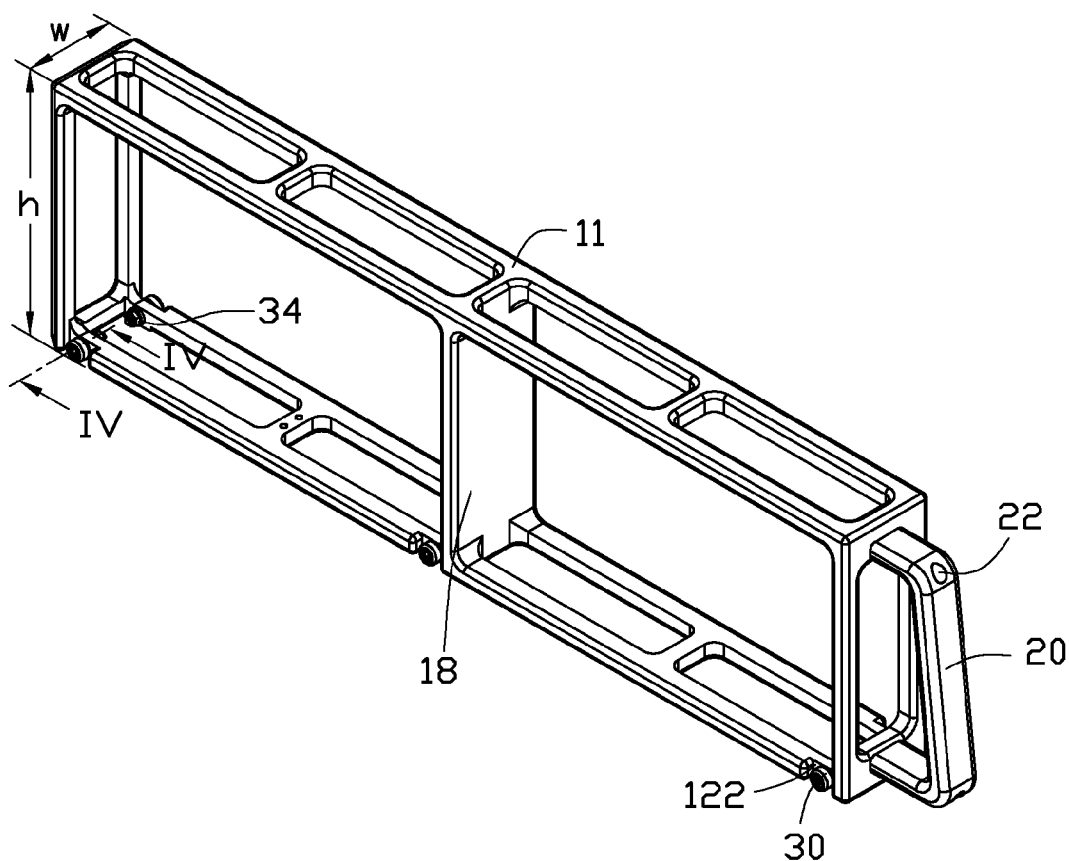
FIG. 3 is an assembled, isometric view of FIG. 2.
Figure 4:
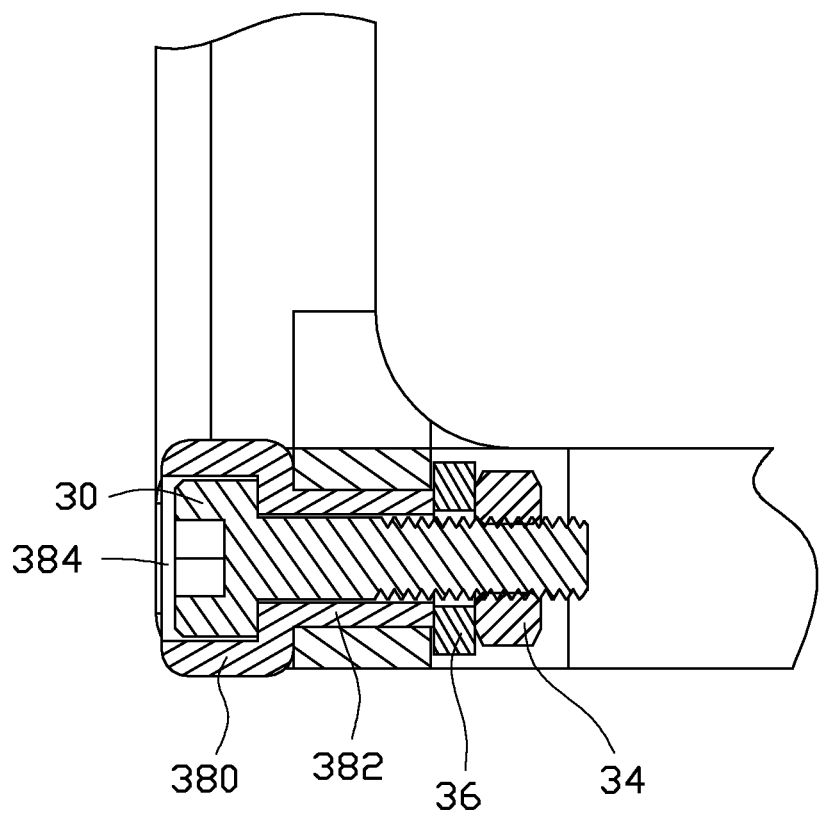
FIG. 4 is a partial, sectional view of FIG. 3, taken along the line of IV-IV.

Referring to FIGS. 3 and 4, in assembly, the handle 20 is attached to the front wall 13 of the frame 10, with the through holes 22 of the handle 10 respectively aligned with the screw holes 16 of the frame 10. Two screws 50 respectively extend through the corresponding through holes 22 of the handle 20 and are screwed into the corresponding screw holes 16 of the frame 10. Thus, the handle 20 is fixed to the front wall 13 of the frame 10.

Two sliding members 30 are installed to opposite ends of a corresponding installing portion 122 of the frame 10, at opposite sides of the bottom wall 12. The extension portion 382 of each wheel 38 is received in a corresponding end of a corresponding through hole 124, and the rolling portion 380 is blocked by a part of the bottom wall 12 between the cutout 126 and the through hole 124. Therefore, the rolling portion 380 of the wheel 38 is accommodated in the cutout 126, with the bottom of the rolling portion 380 protruding out of the bottom of the bottom wall 12. The screw 30 extends through the through hole 384 of the wheel 38 and the washer 36, and is screwed in the nut 34, to rotatably mount the wheel 38 to the frame 10. At this time, the head of the screw 30 is received in the first part of the through hole 384.

A width w (the width of the top or bottom walls 11 and 12) of the frame 10 is equal to a minimum desirable value of a width W (shown in FIG. 1) of one of the receiving spaces 42. A height h (from a top of the top wall 11 to a bottom of the rolling portions 380 of the wheel 38) of the frame 10 is equal to a minimum desirable value of a height H (shown in FIG. 1) of one of the receiving spaces 42.

In use, the handle 20 is manipulated to slidably insert the frame 10 into one of the receiving spaces 42 of the blade enclosure 40. If the frame 10 can be inserted smoothly, the inside size of the receiving space 42 is qualified, then a next receiving space 42 can be tested with the dummy. If all the receiving spaces 42 pass the test, the server blade enclosure 40 is qualified. Otherwise, the blade enclosure 40 is unqualified.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A dummy for testing whether inside dimensions of receiving spaces defined in an enclosure for receiving electrical elements are qualified or not, the dummy comprising:

a rectangular frame to be inserted into each of the receiving spaces, the frame comprising a bottom wall and a plurality of wheels rotatably installed to opposite sides of the bottom wall, the frame having a width and a height respectively equal to a minimum desirable value of an inside width and inside height of one of the receiving spaces; and a handle attached to a front end of the frame, to be manipulated to insert the frame into the receiving spaces;

wherein the opposite sides of the bottom wall forms a plurality of installing portions, the wheels are respectively rotatably installed to the corresponding installing portions, and a bottom of each wheel protrude out of a bottom of the bottom wall;

wherein each installing portion comprises a hole defined in the bottom wall and extending through the opposite sides of the bottom wall, a plurality of screws respectively extends through the wheels and the corresponding holes of the frame, to engage in a plurality of nuts, thereby rotatably mounting the wheels to the bottom wall of the frame; and wherein each wheel comprises a rolling portion and a extension portion extending from a side of the rolling portion, a through hole is axially defined in the wheel through the rolling portion and the extension portion, the through hole comprises a first hole defined in the rolling portion and a second hole defined in the extension portion and less than the first hole in diameter, each screw comprises a head received in the first hole.

2. The dummy of claim 1, wherein the frame further comprises a front wall, a rear wall, and a top wall, the frame is hollow and bounded by the walls.

3. The dummy of claim 2, wherein a rib is substantially perpendicularly connected between the top and bottom walls.

4. The dummy of claim 2, wherein the handle is substantially U-shaped and defines two through holes in opposite ends of the handle, two screw holes are defined in the front wall of the fame, two screws extend through the through holes of the handle to be screwed in the screw holes of the frame.

5. The dummy of claim 1, wherein two cutouts are respectively defined in the opposite sides of the bottom wall, communicating with the hole of the installing portion, to accommodate the rolling portions of the corresponding wheels.

* * * * *